US008193963B2

(12) United States Patent
Wang et al.

(10) Patent No.: US 8,193,963 B2
(45) Date of Patent: Jun. 5, 2012

(54) METHOD AND SYSTEM FOR TIME TO DIGITAL CONVERSION WITH CALIBRATION AND CORRECTION LOOPS

(75) Inventors: You-Jen Wang, Taipei (TW); Shen-Iuan Liu, Taipei (TW); Feng-Wei Kuo, Zhudong (TW); Chewn-Pu Jou, Chutung (TW); Fu-Lung Hsueh, Cranbury, NJ (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 97 days.

(21) Appl. No.: 12/874,462

(22) Filed: Sep. 2, 2010

(65) Prior Publication Data

US 2012/0056769 A1 Mar. 8, 2012

(51) Int. Cl.
*H03M 1/50* (2006.01)

(52) U.S. Cl. ...................... 341/166; 375/376; 324/76.53; 331/1 A; 331/16; 331/17; 331/25; 341/120

(58) Field of Classification Search .......... 341/120–165; 375/376; 331/16–25, 1 A
See application file for complete search history.

(56) References Cited

U.S. PATENT DOCUMENTS

| | | | |
|---|---|---|---|
| 5,727,038 | A | 3/1998 | May et al. |
| 7,279,990 | B2 | 10/2007 | Hasegawa |
| 7,928,888 | B1 * | 4/2011 | Chiu et al. .................... 341/161 |
| 8,031,008 | B2 * | 10/2011 | Wang et al. ...................... 331/16 |
| 2003/0006750 | A1 | 1/2003 | Roberts et al. |
| 2004/0223576 | A1 | 11/2004 | Albasini et al. |
| 2009/0041172 | A1 | 2/2009 | Kim et al. |
| 2009/0147902 | A1 | 6/2009 | Liu et al. |
| 2009/0237131 | A1 | 9/2009 | Shin |
| 2009/0302958 | A1 | 12/2009 | Sakurai et al. |
| 2010/0013532 | A1 | 1/2010 | Ainspan et al. |
| 2010/0264993 | A1 * | 10/2010 | Wang et al. .................. 331/1 A |
| 2011/0084863 | A1 * | 4/2011 | Chiu et al. .................... 341/141 |

OTHER PUBLICATIONS

Chang, H.H. et al., "A Fractional Spur-Free ADPLL with Loop-Gain Calibration and Phase-Noise Cancellation for GSM/GPRS/EDGE", IEEE International Soild-State Circuits Conference, 2008, Session 10, Cellular Transceivers/10.1, pp. 201-203.
Park, Y. et al., "All-Digital Synthesizable UWB Transmitter Architectures", Proceedings of the 2008 IEEE International Conference on Ultra-Wideband (ICUWB2008), vol. 2, pp. 29-32.
Temporiti, E. et al., "A 3 GHz Fractional All-Digital PLL With a 1.8 MHz Bandwidth Implementing Spur Reduction Techniques", IEEE Journal of Solid-State Circuits, Mar. 2009, 44(3):824-834.

* cited by examiner

*Primary Examiner* — Lam T Mai
(74) *Attorney, Agent, or Firm* — Duane Morris LLP

(57) ABSTRACT

Methods and apparatuses for time to digital conversion (TDC) are disclosed. A timing circuit comprises a TDC circuit, a calibration module, and a correction module. The TDC circuit is configured to provide a timing signal indicative of a timing difference between edges of a periodic reference clock signal and a variable feedback signal. The TDC circuit is also configured to provide a delay signal that is variably delayed relative to the reference clock signal. The calibration module is configured to provide a calibration signal to increase and decrease a total delay of the TDC circuit based on a time delay of the calibration signal plus a time delay of a correction signal. The correction module, which is configured to receive the timing signal and provide the correction signal, minimizes harmonic spurs in a frequency response of the timing signal by operating at a frequency of the reference clock signal.

22 Claims, 13 Drawing Sheets

METHOD AND SYSTEM FOR TIME TO DIGITAL CONVERSION WITH CALIBRATION AND CORRECTION LOOPS

BACKGROUND

A time to digital converter (TDC) is a circuit known in the art to detect phase offset (such as jitter) between two signals, e.g., a control signal of a phase locked loop and a reference clock signal.

FIG. 1 is a block diagram of a known TDC in a configuration known as a Vernier delay line. The principles of this TDC 100 are described in U.S. Pat. Pub. No. 2009/0225631 by Shimizu et al., "Time-To-Digital Converter," which is hereby incorporated by reference herein in its entirety. The TDC 100 has a first delay line in which a sequence of delay cells 114 are arranged to sequentially delay an original clock CK. Each delay cell 114 delays its input by a predetermined delay amount $\tau 1$, and a plurality of delay taps CK1, CK2, CK3, . . . are provided to the data (D) inputs of corresponding D-type flip flops 116. A signal SC to be measured is provided to a second delay line in which each delay cell in a sequence of delay cells 115 delays its input by a predetermined delay amount $\tau 2$, where $\tau 1$ is typically greater than $\tau 2$. The first and second delay lines may be implemented using pairs of inverters, for example. Successive taps from the second delay line are provided as clock inputs SC1, SC2, SC3, . . . to corresponding flip flops 116.

Because $\tau 1 > \tau 2$, signals in the sequence SC1, SC2, SC3, . . . are advanced relative to signals in the sequence CK1, CK2, CK3, . . . . In other words, if a rising clock edge of CK1 occurs before a rising clock edge of SC1, there will be a point along the first and second delay lines at which a delay tap from the second sequence 115 "catches up" to a corresponding delay tap from the first sequence 114. In this example, the Q outputs from flip flops 116 are '1' up to this point and '0' thereafter. An encoder circuit 117 receives the Q outputs and encodes a position at which such crossover occurs, and the encoded result represents the jitter of the signal SC to be measured with respect to the reference clock CK. For example, if $2^N$ flip flops are employed, encoder 117 provides an N-bit encoded value representing a jitter of signal SC.

Conventional TDC 100 has certain deficiencies. Due to variations in process, voltage, and temperature, the total delay of a delay line may be different than the desired value, resulting in certain disadvantageous effects. For example, a variation in the total delay of delay cells 115 may result in undesirable phase noise in the encoded signal indicating jitter. Furthermore, mismatch between individual delay cells may result in other disadvantageous effects. For example, variations in the delays of delay cells 115 may result in harmonic "spurs" (spurious noise components) in a frequency response of the encoded jitter signal. Both these disadvantageous effects impair the ability to accurately measure jitter.

FIG. 2 is a block diagram of a known timing circuit 200 that seeks to address the phase noise and spur problems discussed above. Timing circuit 200 is fully described in Temporiti et al., "A 3 GHz Fractional All-Digital PLL With a 1.8 MHz Bandwidth Implementing Spur Reduction Techniques," IEEE Journal of Solid-State Circuits, Vol. 44, No. 3, pp. 824-34, March 2009, and only a brief description of the principles of that circuit follows. Circuit 200 includes a TDC 230 as well as feedback to control delay cells in the TDC 230. A signal $CK_{DCO}$ to be measured, provided by a digitally controlled oscillator, is provided to D inputs of D-type flip flops 240-1, 240-2, . . . , 240-N (generally 240). A reference clock signal $CK_{REF}$ is provided to a clock doubler 210 that also receives input from a pseudorandom number generator (PRNG) 220. The reason for the presence of the clock doubler 210 and the PRNG 220 will be apparent shortly. Much as in TDC 100, the output from the clock doubler 210 is provided to delay cells 250-1, 250-2, . . . , 250-N (generally 250), and successive delay taps are provided to clock inputs of corresponding D flip flops 240. The output from TDC 230 is an encoded signal representing a jitter between $CK_{DCO}$ and $CK_{REF}$, and this output is shown in FIG. 2 as emanating from the last flip flop 240-N for convenience, although it is understood that an encoder (not shown) provides encoding much as in FIG. 1.

A calibration module 260, comprising a grouper 262 to process groups of bits, an adder 264, a low pass filter 266, and a quantizer 268, provides a calibration signal based on the encoded output from TDC 230. A correction module 270 provides N correction signals that are added to the calibration signal at adders 280-1, 280-2, . . . , 280-N and used to control delay cells, e.g., via principles of variable capacitance. Thus, calibration and correction loops are present in a feedback configuration. The effects of the calibration and correction modules are to reduce phase noise and spurs, respectively. The clock doubler 210 is needed because 50% of available cycles are set aside for calibration. The PRNG 220 is used to inject pseudorandom jitter to improve performance, including by reducing unwanted periodicities.

The calibration loop in circuit 200 collects many input signals (groups of five signals for integration), resulting in a relatively long calibration time. Circuit 200 needs multipliers in correction module 270, requiring large silicon area in a practical embodiment. Clock doubler 210 and PRNG 220 area also needed, resulting in high power consumption, which decreases performance in terms of noise. Because of the clock doubler 210 and the use of 50% of samples for calibration, the operation speed of circuit 200 is twice the input frequency.

FIG. 3 is a block diagram of another known timing circuit. Circuit 300 is described in Chang et al., "A fractional spur free all-digital PLL with loop gain calibration and phase noise cancellation for GSM/GPRS/EDGE," IEEE Int. Solid-State Circuits Conf. (ISSCC) Dig. Tech. Papers, pp. 222-23, 598, February 2008. Circuit 300 includes a phase frequency detector and cyclic TDC 310 that receives a reference clock $CK_{REF}$ and a feedback signal $CK_{FB}$. As part of a phase locked loop, circuit 300 provides a digital loop filter 330, a digitally controlled oscillator 332, and a divider 234 that provides the feedback signal $CK_{FB}$. A sigma-delta modulator 340 is used to randomly change a frequency division value of the divider 234 to reduce spurious noise. Sigma-delta modulators are known in the art and are described at, e.g., U.S. Pat. No. 7,279,990, by Hasegawa, "Sigma-Delta Modulator for PLL Circuits," which is hereby incorporated by reference herein in its entirety. Sigma-delta modulator 340 receives a numerator value F that is accumulated in a manner that causes the frequency division ratio of divider 234 to vary. A scale factor 370, which is the ratio of an output clock period to the delay time of a delay cell, is used to update the phase locked loop. The scale factor replaces the calibration loop of circuit 200 for phase noise mitigation. Circuit 300 does not contain a correction loop, resulting in phase noise performance of circuit 300 being worse than that of circuit 200. With adders 320, 342 and 350, delay element 360, scale factor 370, and multiplier 380, the input to the digital loop filter 330 is controlled in a manner that provides some phase noise cancellation. The use of a cyclic TDC, in which the output of a last delay cell feeds back to an input of a first delay cell, reduces the number of delay cells but induces in-band phase noise. The use of a multiplier 380 increases silicon area. The performance of circuit 300 in terms of spurs and phase noise is worse than that of circuit 200.

It is desirable to employ TDC timing techniques that reduce phase noise and spurs with reduced circuit complexity and increased efficiency.

SUMMARY

An embodiment discloses a timing circuit comprising a time to digital conversion (TDC) circuit, a calibration module, and a correction module. The TDC circuit is configured to provide a timing signal indicative of a timing difference between edges of a periodic reference clock signal and a variable feedback signal. The TDC circuit also is configured to provide a delay signal that is variably delayed relative to the reference clock signal. The calibration module is configured to receive the delay signal and a second feedback signal and provide a calibration signal to increase and decrease a total delay of the TDC circuit. The total delay of the TDC circuit is based on a time delay of the calibration signal plus a time delay of a correction signal. The correction module is configured to receive the timing signal and provide the correction signal. The correction module minimizes harmonic spurs in a frequency response of the timing signal by operating at a frequency of the reference clock signal.

The timing circuit may also include a digital loop filter (DLF), a digitally controlled oscillator (DCO), a divider, and a counter. The DLF is configured to provide a digital control signal based on the timing signal. The DCO is configured to tune a frequency of an output clock signal based on the digital control signal. The divider is configured to divide the output clock signal in frequency by an integer M or an integer M+1 and provide a divided signal that feeds back to the TDC circuit as the first feedback signal and that feeds back to the calibration module as the second feedback signal. The counter is configured to accumulate the first feedback signal and provide an increment signal. The increment signal causes the divider to divide by M+1 instead of M in an event that an accumulated sum of the first feedback signal exceeds a predetermined threshold.

Another embodiment discloses a method of controlling timing signals. A reference clock signal and first and second feedback signals are received. The reference clock signal is delayed via N delay cells to provide a delay signal. A timing signal is generated at a frequency of the reference clock signal. The timing signal is indicative of a timing difference between edges of the reference clock signal and of the first feedback signal. Delay cells are adjusted based on the delay signal, the second feedback signal, and the timing signal to calibrate a total delay of the delay cells and to reduce mismatch among delay cells.

The method may also include generating a digital control signal based on the timing signal via a low pass filtering operation. A frequency of an output clock signal is tuned based on the digital control signal. The output clock signal is divided in frequency by an integer M or an integer M+1 to provide a divided signal, which is fed back as the first and second feedback signals. The first feedback signal is accumulated, and the output clock signal is divided in frequency by M+1 in an event the accumulated first feedback signal exceeds a predetermined threshold.

The construction and method of operation of various embodiments, however, together with additional advantages thereof will be best understood from the following descriptions of specific embodiments when read in connection with the accompanying figures.

BRIEF DESCRIPTION OF THE DRAWINGS

The following will be apparent from elements of the figures, which are provided for illustrative purposes and are not necessarily to scale.

DETAILED DESCRIPTION

Figure 4:
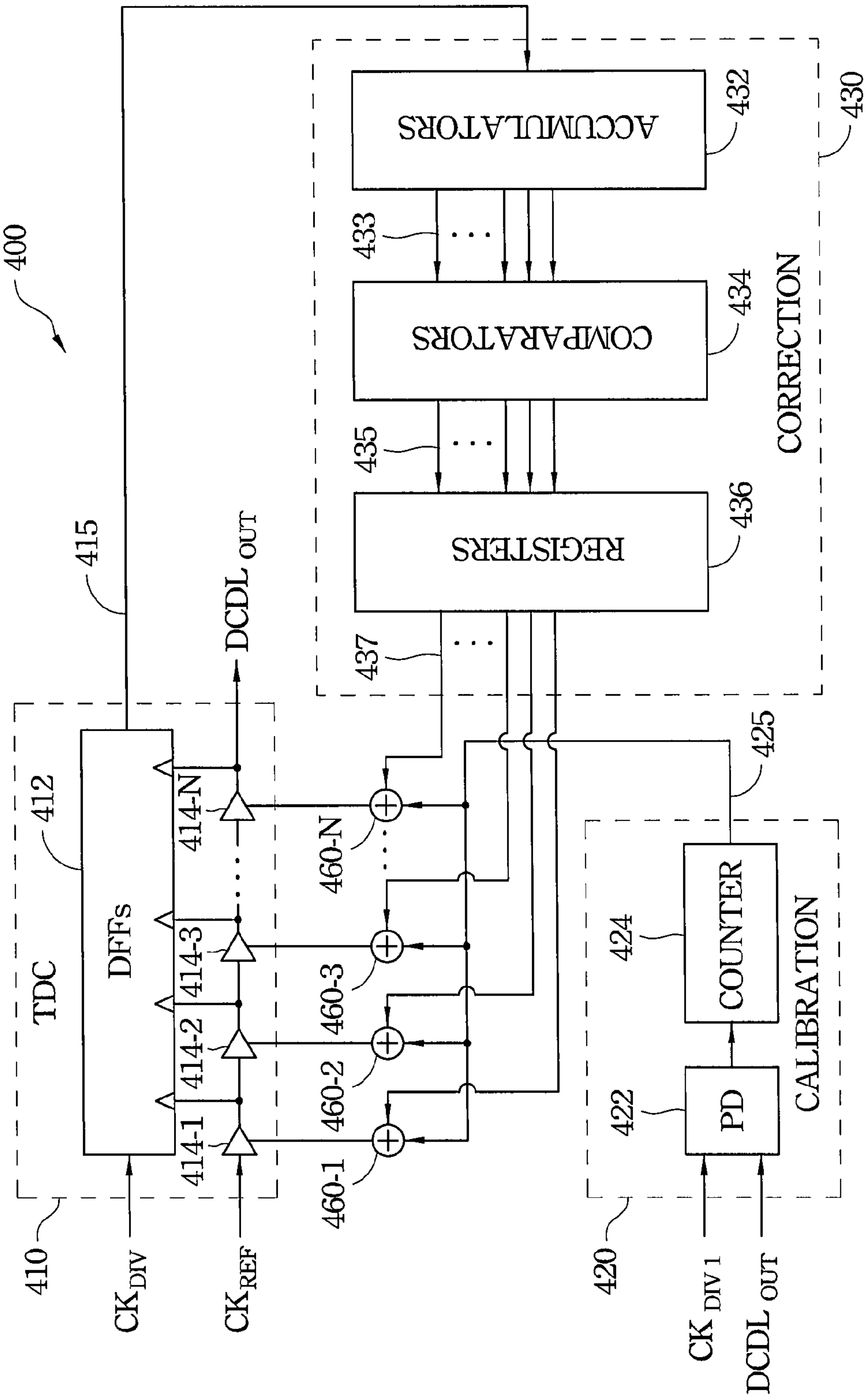
FIG. 4 is a block diagram of a timing circuit in accordance with an exemplary embodiment.

FIG. 4 is a block diagram of a timing circuit in accordance with an exemplary embodiment. Circuit 400 includes a time to digital conversion (TDC) circuit 410, a calibration module 420 for phase noise reduction, and a correction module 430 for spur reduction. Calibration module 420 and correction module 430 are arranged in feedback configuration to provide calibration and correction loops that can be implemented with simpler circuits than those found in prior art systems. As a result, silicon area and power are saved, and performance in terms of phase noise and spurs is increased relative to the prior art.

Figure 4A:
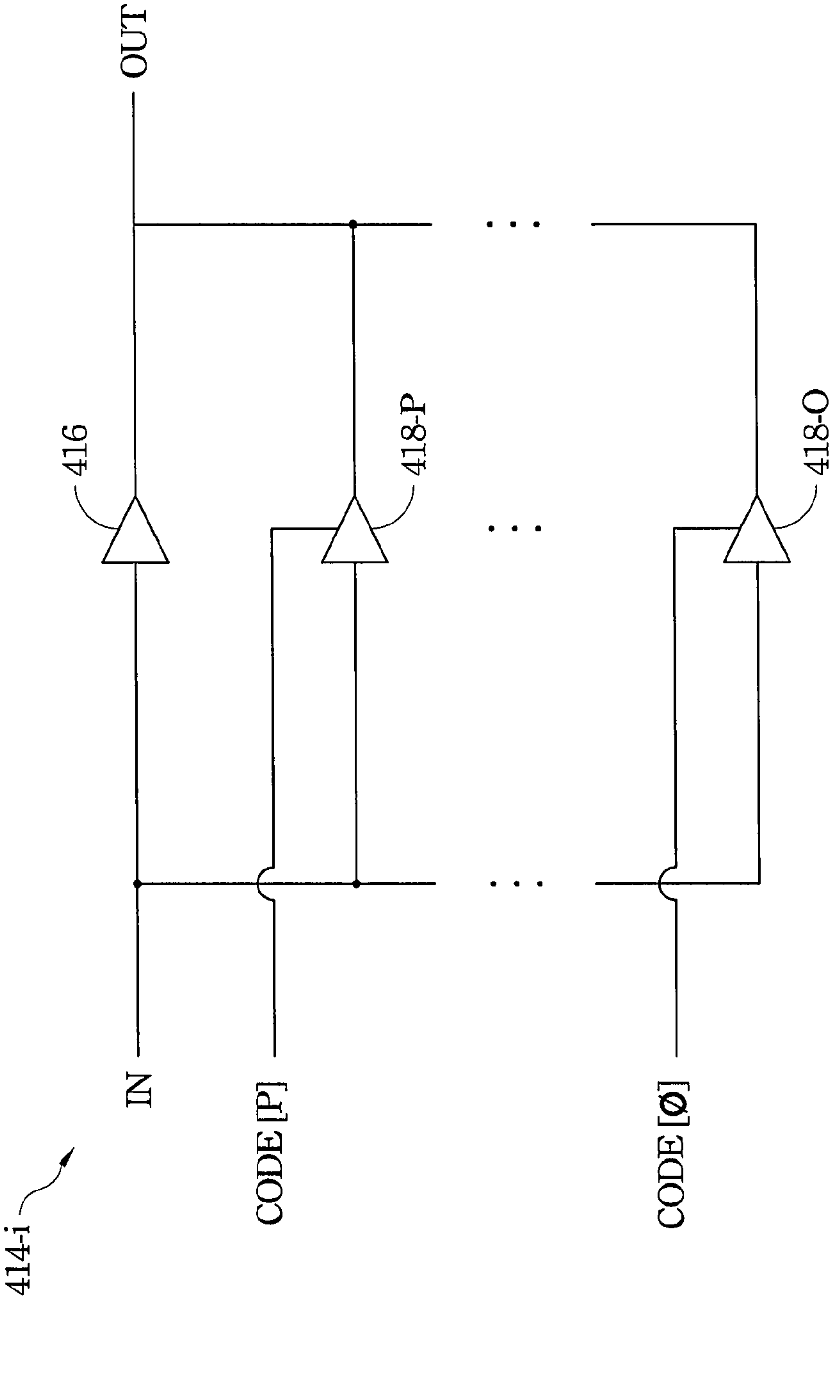
FIG. 4A is a block diagram of a delay cell using tri-state buffers.

TDC circuit 410 includes a plurality of latches 412 configured to switch values of a feedback signal $CK_{DIV}$ based on a reference clock signal $CK_{REF}$. Specifically, in an example where the latches are D-type flip flops, $CK_{REF}$ is provided to a delay line comprising delay cells 414-1, 414-2, 414-3, . . . , 414-N (generally 414), each of which may be a pair of inverters or composed of other suitable delay elements as known in the art. In an embodiment, N is 16, although other values may be used as well. Delay taps from delay cells 414 are provided to clock edges of the flip flops 412. An output of delay cell 414-N, referred to as $DCDL_{OUT}$ because it is the variably delayed output of a digitally controlled delay line, corresponds to $CK_{REF}$ delayed by one period of $CK_{REF}$ when calibration is achieved as described further below. Delay cells 414 are adjusted (increased or decreased in delay) based on signals from calibration module 420 and correction module 430 that are summed at adders 460-1, 460-2, 460-3, . . . , 460-N (generally 460), which may be implemented as multiple adders or as a single adder 460. $CK_{DIV}$ may be coupled to a delay line, e.g., in a Vernier delay line configuration (not shown) as known in the art. TDC circuit also includes an encoder (not shown) that encodes a timing signal 415 indicative of a jitter of $CK_{DIV}$ relative to $CK_{REF}$. Timing signal 415 may be a P-bit signal, where $N=2^P$. Delay cells 414 may be implemented using tri-state buffers known in the art, e.g., as described in Park et al., "All-Digital Synthesizable UWB Transmitter Architectures," Proc. of the 2008 IEEE Int. Conf. on Ultra-Wideband (ICUWB2008), Vol. 2, p 30, 2008. FIG. 4A is a block diagram of a delay cell using tri-state buffers. Delay cell 414-*i* may be any of the delay cells 414 in FIG. 4. Delay cell 414-*i* includes a buffer 416 and P tri-state buffers 418-0, . . . , 418-P (418 generally) coupled in parallel. The tri-state buffers 418 receive respective enable inputs from respective bits of the timing signal 415. When turned off, the output of each tri-state buffer 418 is high-impedance ('Z'), thereby switching to increased delay. Conversely, when a tri-state inverter 418 is turned on, delay time is decreased. Thus, delay between nodes IN and OUT may be tuned by P bits of the timing signal 415. Calibration module 420 receives $DCDL_{OUT}$ and $CK_{DIV1}$, which is $CK_{DIV}$ shifted in time. $CK_{DIV}$ is a variable feedback signal provided by a phase locked loop, and the feedback signal arrives at different times at different portions of circuit 400. Therefore, it is convenient to refer to $CK_{DIV}$ as a first feedback signal and $CK_{DIV1}$ as a second feedback signal, as these are the same signal arriving at different times at different locations.

Calibration module 420 includes a phase detector 422 and a counter 424, and the resulting calibration signal 425 is provided to each of the adders 460. Correction module 430 receives the timing signal 415. An array of accumulators 432 processes the timing signal to provide accumulation signals 433 to an array of comparators 434. Comparators 434 provide comparison signals 435 to an array of registers 436, which store the comparison signals and provide N correction signals 437. Accumulation signals 433, comparison signals 435, and correction signals 437 may respectively be provided as multiple signals (as shown in FIG. 4) or as single signals, as is known in the art. The N correction signals 437 are provided to corresponding adders 460 to adjust different delay cells 414 differently so as to reduce delay mismatch among the delay cells 414.

Figure 5:
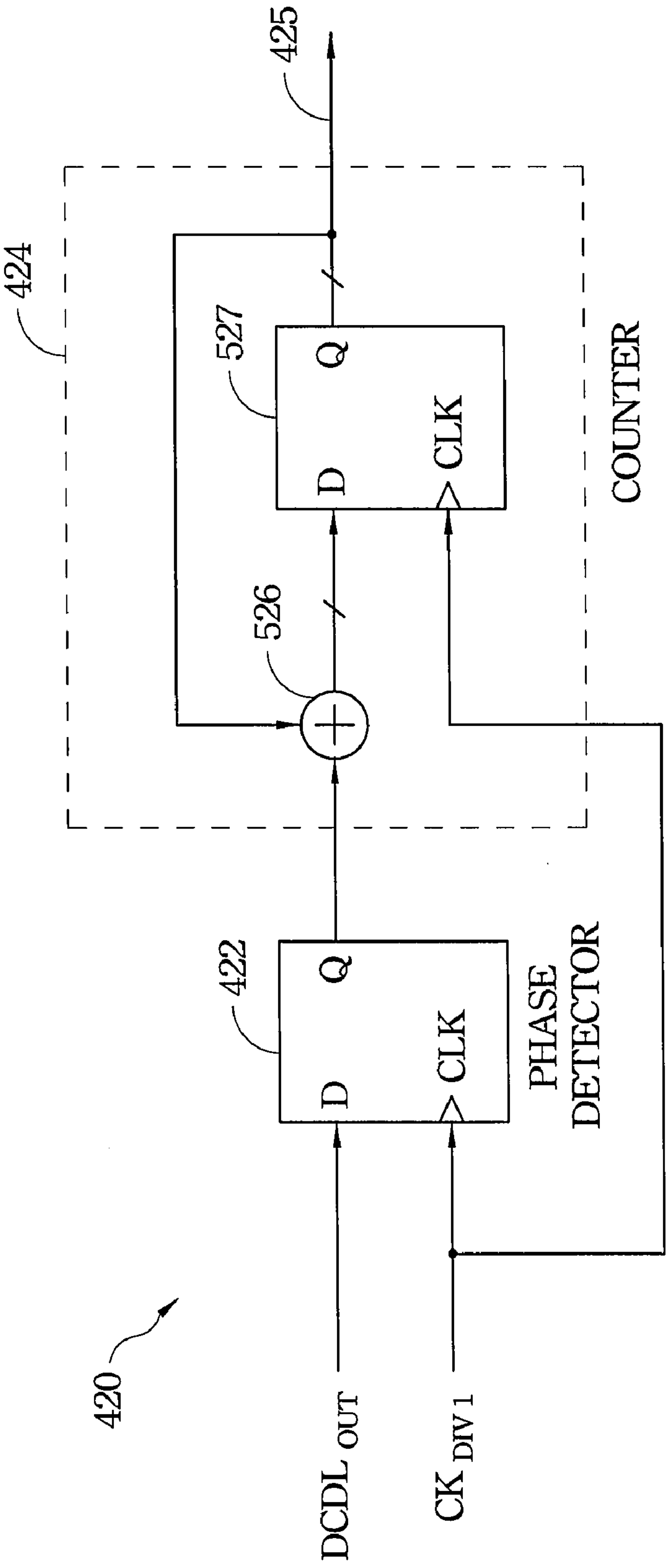
FIG. 5 is a block diagram of a calibration module in accordance with an embodiment.
Figure 6:
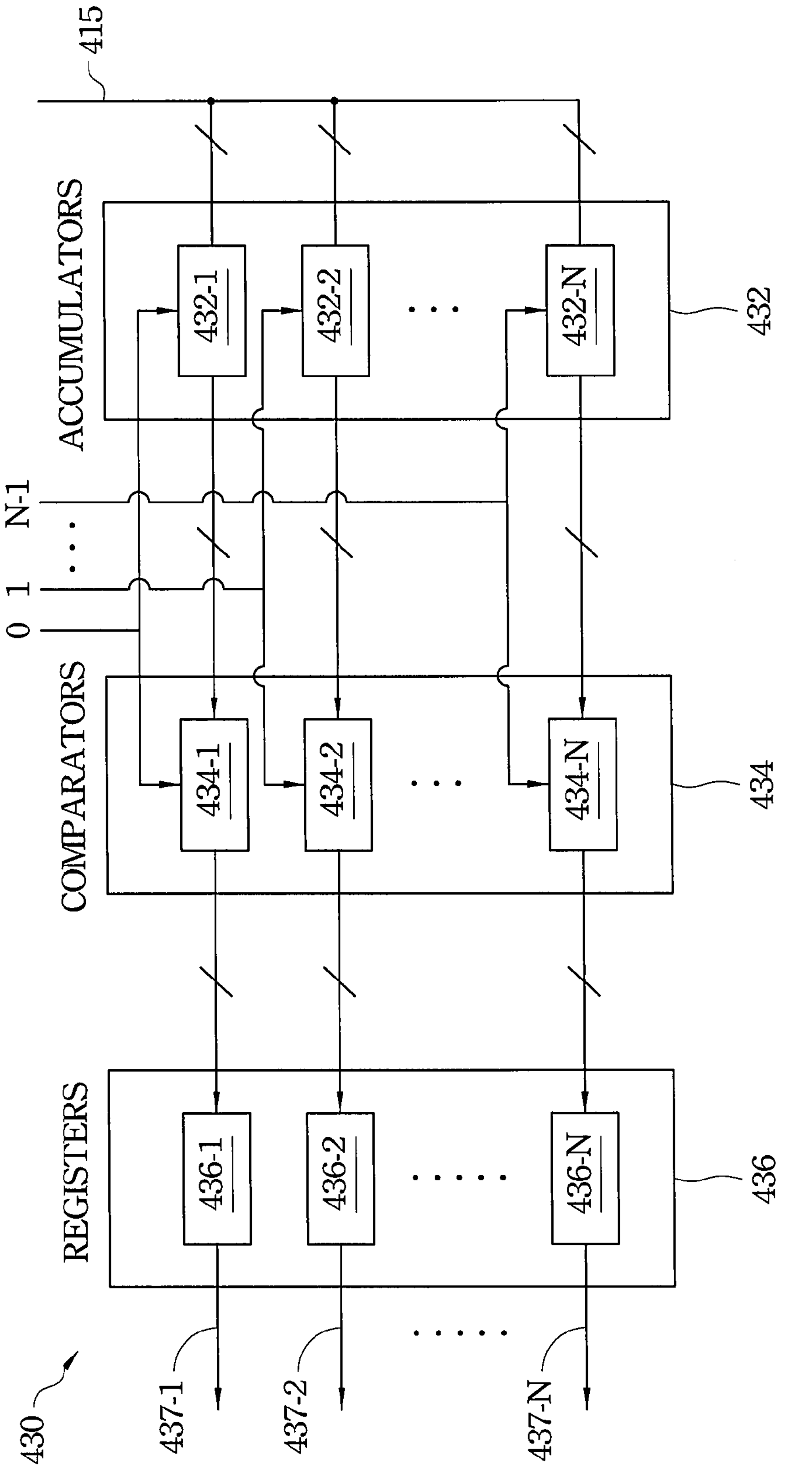
FIG. 6 is a block diagram of a correction module in accordance with an exemplary embodiment.

FIG. 5 is a block diagram of a calibration module in accordance with an embodiment. Calibration module 420 includes a phase detector 422 and a counter 424 as shown in FIG. 4. The phase detector may be a latch, e.g., a D-type flip flop 422. $DCDL_{OUT}$ is coupled to a D input of the flip flop 422, and $CK_{DIV1}$ is coupled to a clock input. Phase detectors employing flip flops are known in the art and are described at, e.g., U.S. Pat. No. 4,593,253 by McCabe et al., "Flip-Flop Phase Detector Circuit for Phase Locked Loop," and at U.S. Pat. Pub. No. 2009/0041172 by Kim et al., "Phase Detection Circuit," both of which are hereby incorporated by reference herein in their entirety. Phase detector 422 compares the phase of inputs $DCDL_{OUT}$ and $CK_{DIV1}$. If the phase of $DCDL_{OUT}$ leads $CK_{DIV1}$, flip flop 422 provides a Q output at a high level. If the phase of $DCDL_{OUT}$ lags $CK_{DIV1}$, flip flop 422 provides a Q output at a low level. The Q output from flip flop 422 is provided to an adder 526, which provides a multi-bit output to a latch 527, e.g., to a D input of a flip flop 527. $CK_{DIV1}$ is coupled to a corresponding clock input. A Q output of flip flop 527 is fed back to adder 526, so that counter 424 accumulates the output of phase detector 422. The accumulated multi-bit output is provided as calibration signal 425, which is used to adjust a delay of each delay cell 414. When the calibration loop is locked, the signals $DCDL_{OUT}$ and $CK_{DIV1}$ are in phase, and the total delay time is equal to the phase difference between $CK_{DIV}$ and $CK_{DIV1}$ FIG. 6 is a block diagram of a correction module in accordance with an exemplary embodiment. Multi-bit timing signal 415 is provided to each accumulator 432-1, 432-2, . . . , 432-N (generally 432) in the array of accumulators 432. The $i^{th}$ accumulator 432-*i*, with i ranging between 1 and N, inclusive, also receives a constant value i−1. The output from each accumulator 432-*i* is provided to a corresponding comparator 434-*i* among comparators 434-1, 434-2, . . . , 434-N (generally 434). The $i^{th}$ comparator 434-*i*, with i ranging between 1 and N, inclusive, also receives a constant value i−1, and compares the value received from accumulator 432-*i* with this constant value. Registers 436-1, 436-2, . . . , 436-N (generally 436) store the comparison outputs from corresponding comparators 434. Outputs from registers 436 are provided as corresponding correction signals 437-1, 437-2, . . . , 437-N (generally 437). Details of accumulators 432, comparators 434, and registers 436 are provided below.

Figure 7:
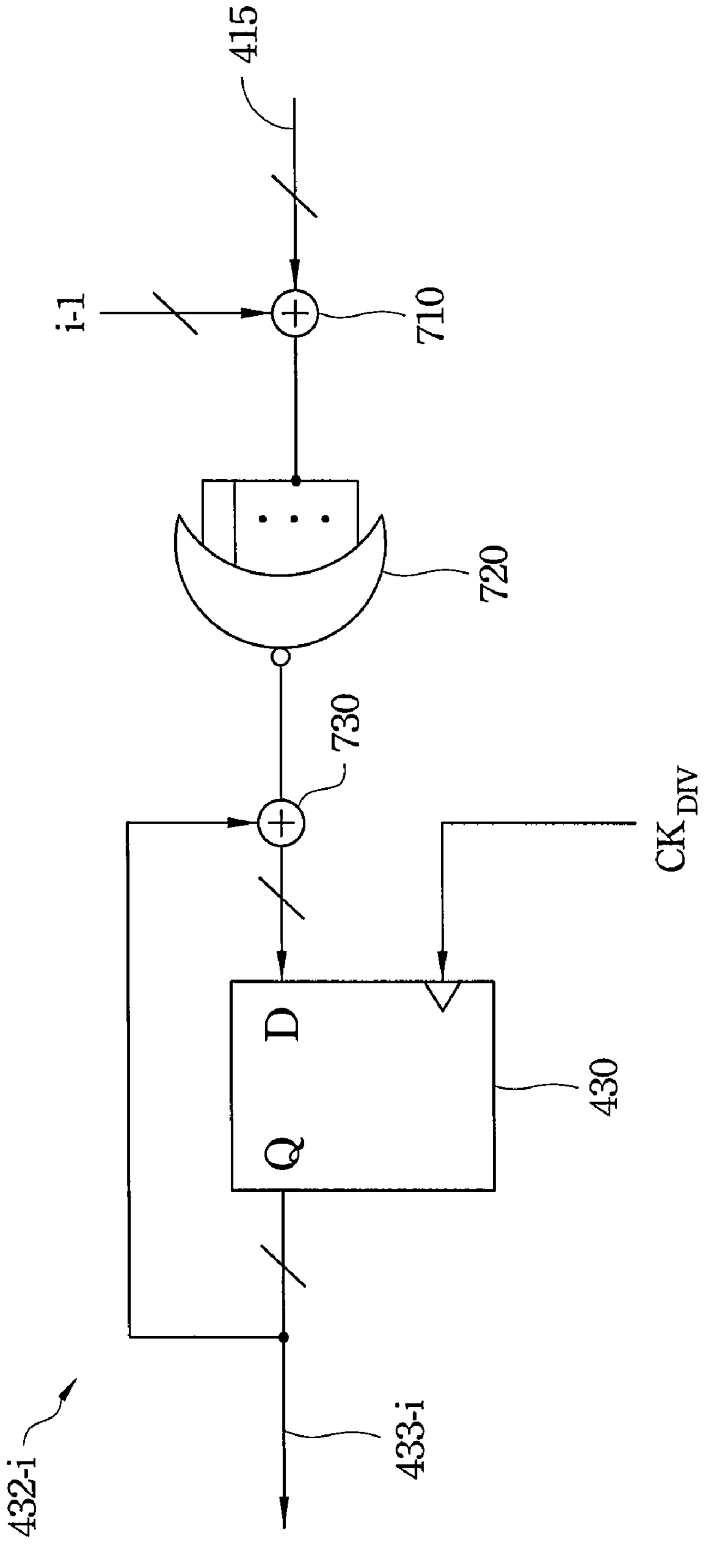
FIG. 7 is a block diagram of an accumulator in accordance with an exemplary embodiment.

FIG. 7 is a block diagram of an accumulator in accordance with an exemplary embodiment. Accumulator 432-*i* shown in FIG. 7 may be any of the N accumulators 432. Timing signal 415 and a constant value i−1 are added at adder 710, with the result provided to a logic gate 720. In an embodiment, each bit of the output of adder 710 is fed to an input of a gate 720 that effects a logical NOR operation. An output of gate 720 is coupled to an input of an adder 730, an output of which is coupled to a data input of a latch 740, e.g., to a D input of a flip flop 740. $CK_{DIV}$ is coupled to a clock input of flip flop 740. A Q output of flip flop 740 is fed back to adder 730 and also provided as accumulation signal 433-*i*, so that accumulator 432-*i* is configured to accumulate the outputs of the TDC circuit 410. In an embodiment, adder 710 is a subtractor, i.e., one of the inputs is negated prior to addition. Accumulator 432-*i* increments an accumulated value if each input to gate 720 is at a low level ('0'). When the value of the timing signal 415 is equal to the constant value i−1, the output of the adder 710 is zero, and the output of NOR gate 720 is at a high level. Thus, the accumulator 432-*i* is increased by 1. Therefore, the distribution of timing signal 415 is recorded in accumulator 432-*i*, similar to a histogram.

Figure 8:
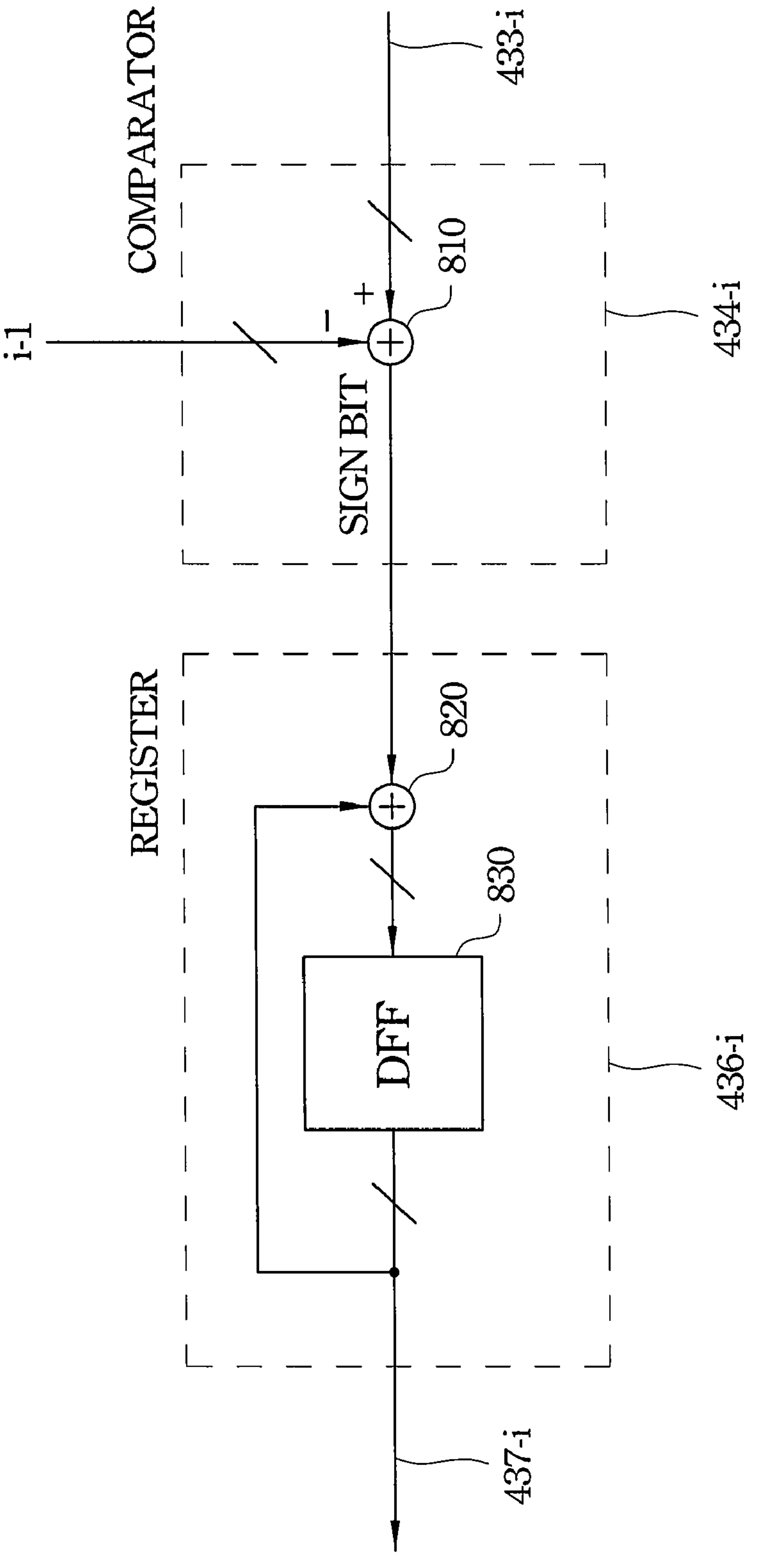
FIG. 8 is a block diagram of a comparator and a register in accordance with an exemplary embodiment.

FIG. 8 is a block diagram of a comparator and a register in accordance with an exemplary embodiment. Comparator 434-*i* shown in FIG. 8 may be any of the N comparators 434. Accumulation signal 433-*i* is compared to constant value i−1 using conventional techniques, e.g., an adder 810 configured to subtract i−1 from accumulation signal 433-*i* and provide a resulting sign bit. The sign bit is coupled to an input of an adder 820, a multi-bit output of which is coupled to a data input of a latch 830, e.g., to a D input of a flip flop 830. A clock input of flip flop 830 is not shown in FIG. 8 for convenience but may be $CK_{DIV}$. An output of flip flop 830 is fed back to adder 820 and is also provided as correction signal 437-*i*. Thus, comparator 434-*i* compares the output from accumulator 432-*i* with a constant value i−1, and register 436-*i* records the output of the comparator.

Figure 9:
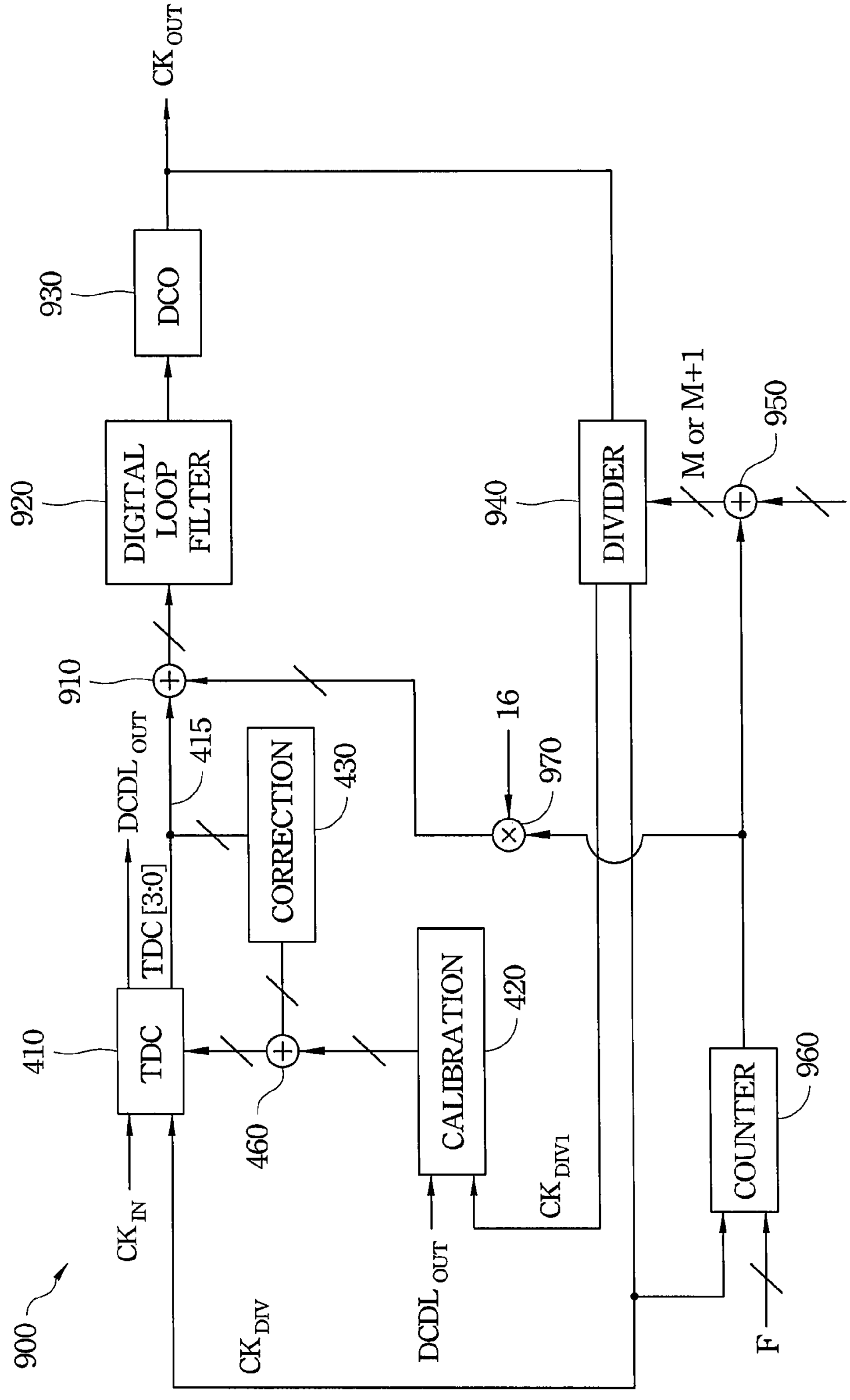
FIG. 9 is a block diagram of a phase locked loop in accordance with an exemplary embodiment.

FIG. 9 is a block diagram of a phase locked loop in accordance with an exemplary embodiment. Phase locked loop 900, which may be used in frequency synthesizer applications and the like, comprises TDC circuit 410, calibration module 420, correction module 430, and adder 460 described above, as well as additional elements described below. TDC circuit 410 receives an input clock signal $CK_{IN}$, which may be the reference clock signal $CK_{REF}$ of FIG. 4, and a feedback signal $CK_{DIV}$. TDC provides a timing signal 415, which is labeled TDC[3:0] in FIG. 9 to indicate that the timing signal 415 may be 4 bits when N=16 delay cells are used as in FIG. 4.

Timing signal 415 is provided to a digital loop filter 920 via an adder 910, which enables the timing signal 415 to be modified by a cancellation loop as described further below. Digital loop filters (DLFs) are known in the art and perform analogous processing for digital phase locked loops (PLLs) as analog loop filters perform in analog PLLs. For example, a DLF is described in detail at U.S. Pat. Pub. No. 2009/0302958 by Sakurai et al., "Digitally Controlled Oscillator and Phase Locked Loop Circuit Using the Digitally Controlled Oscillator," hereby incorporated by reference herein in its entirety. Functional details of a DLF in accordance with an embodiment are provided further below in the context of FIG. 10. DLF 920 provides control signals to tune a digitally controlled oscillator (DCO) 930.

DCOs are known in the art for providing analogous functionality for digital PLLs as voltage controlled oscillators provide for analog PLLs and are described at, e.g., U.S. Pat. No. 5,727,038 by May et al., "Phase Locked Loop Using Digital Loop Filter and Digitally Controlled Oscillator," which is hereby incorporated by reference herein in its entirety. DCO 930 adjusts the frequency of an output signal $CK_{OUT}$ so that clock frequencies may be matched (locked) by the phase locked loop 900. DCO 930 may be implemented with nonlinear capacitors, active inverter stages, or other conventional DCO techniques as known in the art and described at, e.g., U.S. Pat. Pub. No. 2010/0013532 by Ainspan et al., "Phase-Locked Loop Circuits and Methods Implementing Multiplexer Circuit for Fine Tuning Control of Digitally Controlled Oscillators," hereby incorporated by reference herein in its entirety. $CK_{OUT}$ is divided in frequency by a divider 940, which divides by an integer M or M+1. Such variable division is known in the art of fractional-type PLLs and is described at, e.g., U.S. Pat. Pub. No. 2004/0223576 by Albasini et al., "Fractional-Type Phase Locked Loop Circuit with Compensation of Phase Errors," hereby incorporated by reference herein in its entirety.

Figure 1:
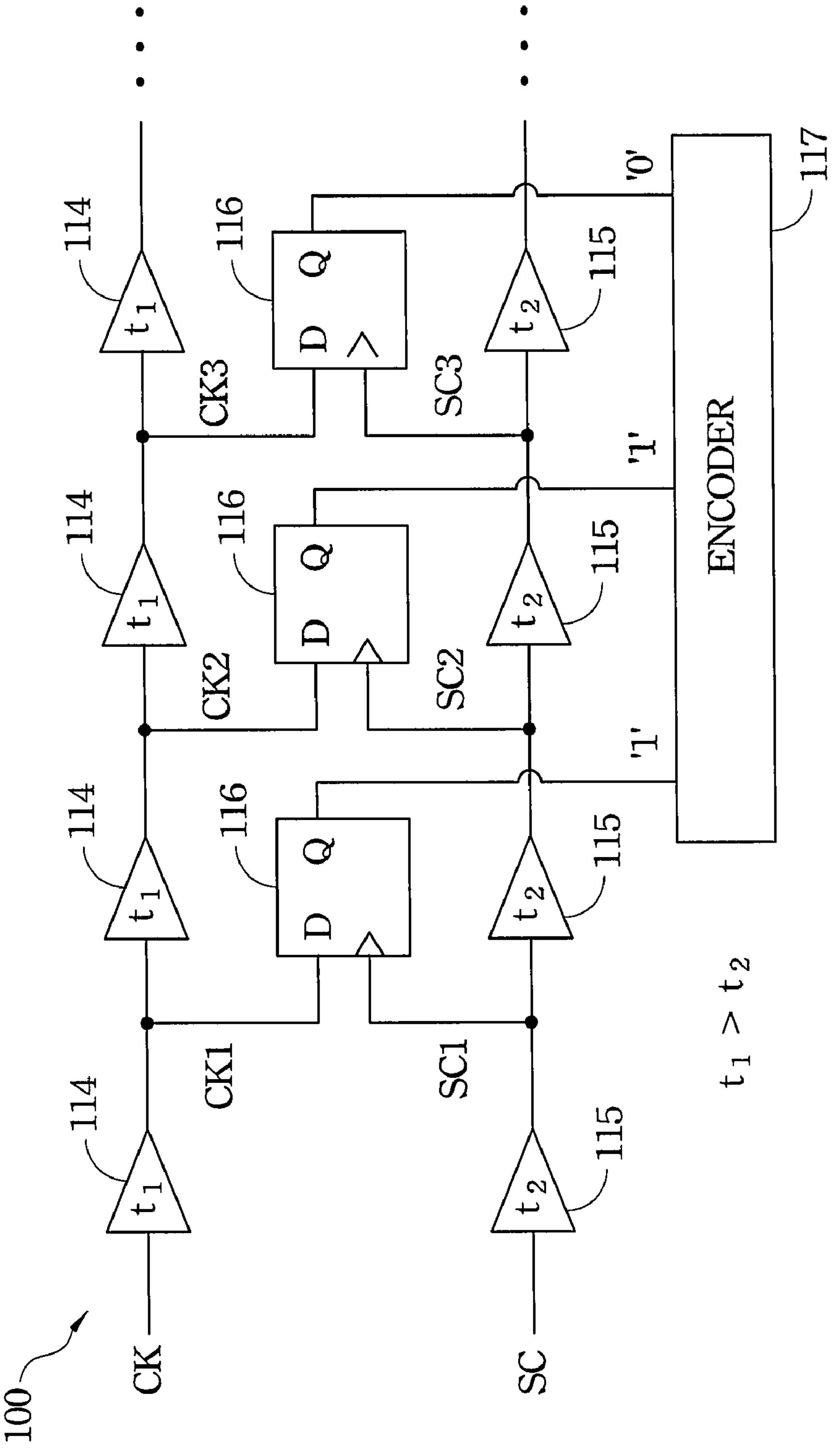
FIG. 1 (PRIOR ART)
FIG. 1 is a block diagram of a known TDC in a Vernier delay line configuration.
Figure 2:
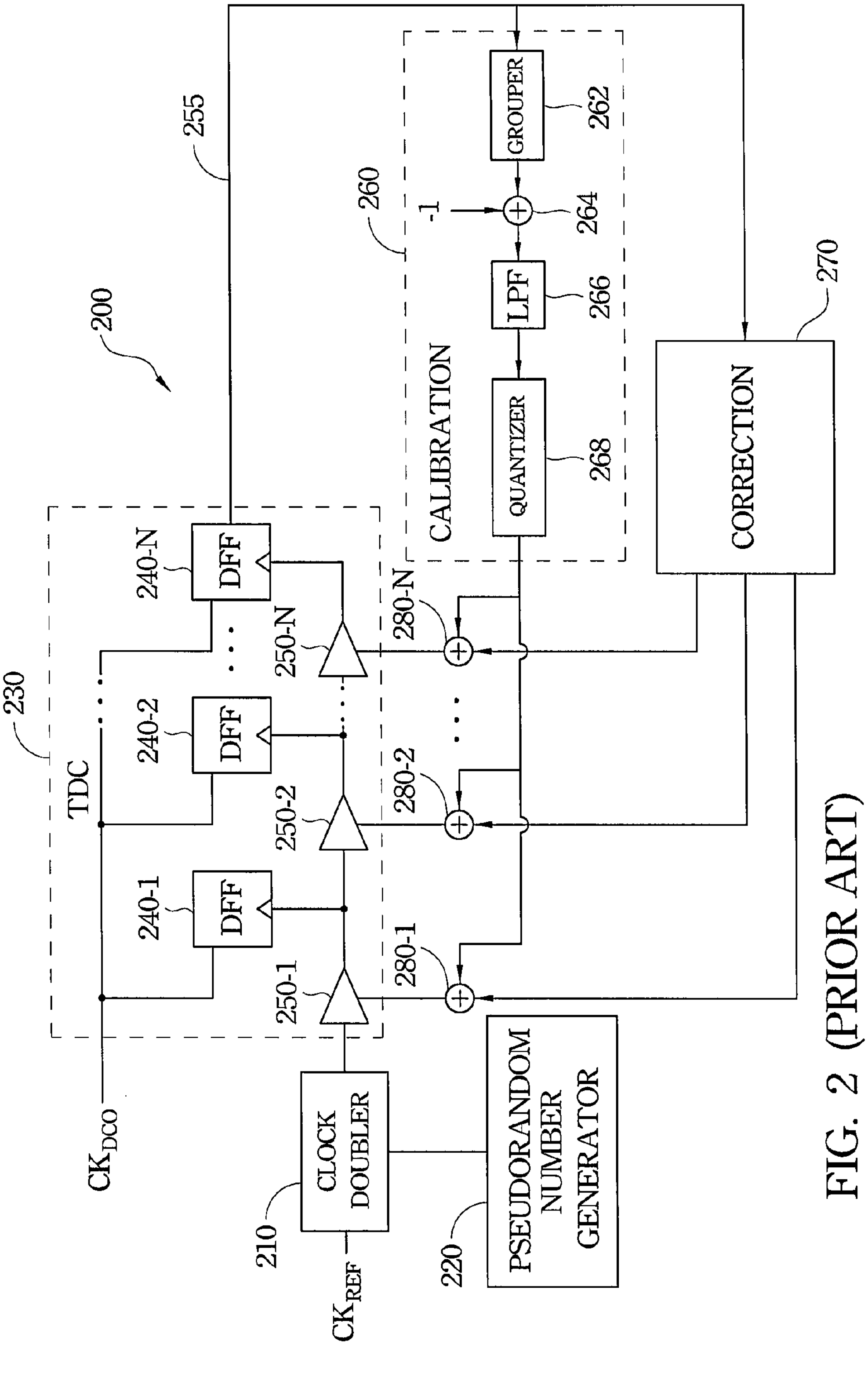
FIG. 2 (PRIOR ART)
FIG. 2 is a block diagram of a known timing circuit.
Figure 9A:
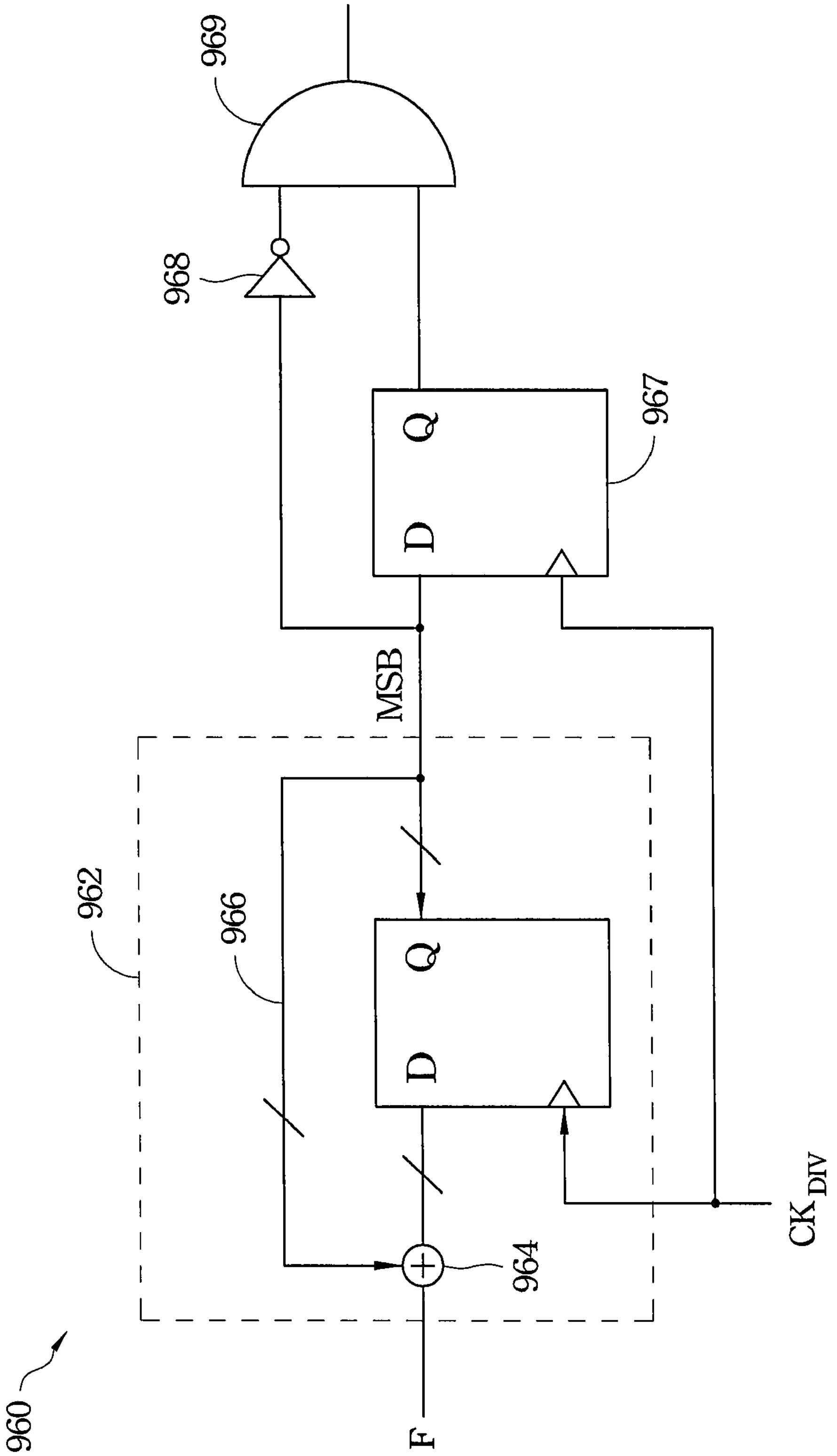
FIG. 9A is a block diagram of a counter used with a divider for fractional variation in accordance with an exemplary embodiment.

As is known in the art, providing fractional division enables greater accuracy and resolution for timing applications. A counter 960 provides an increment signal that is either 0 or 1 and that is added to constant integer value M at adder 950 to determine whether divider 940 divides by M or M+1. A counter 960 for fractional-type PLLs is known in the art and described at, e.g., U.S. Pat. No. 7,279,990 by Hasegawa. FIG. 9A is a block diagram of an example implementation of counter 960. Referring to FIG. 9A, a numerator value F is accumulated using an accumulator 962 comprising adder 964 and flip flop 966 based on clock signal CKDIV. The most significant bit of the Q output of flip flop 966 is provided to another flip flop 967 and to an inverter 968. An output of an AND gate 969 coupled to inverter 968 and flip 967 at its inputs is provided to divider 940. In other words, when the accumulated value exceeds a denominator value (modulo value) corresponding to a predetermined threshold, an overflow condition is met, and the divisor is incremented by one to M+1. In an embodiment, the output of counter 960 is provided to a cancellation loop, illustrated depicted in FIG. 9 with a multiplier 970 corresponding to multiplier 380 of FIG. 2, to further reduce phase noise.

Figure 3:
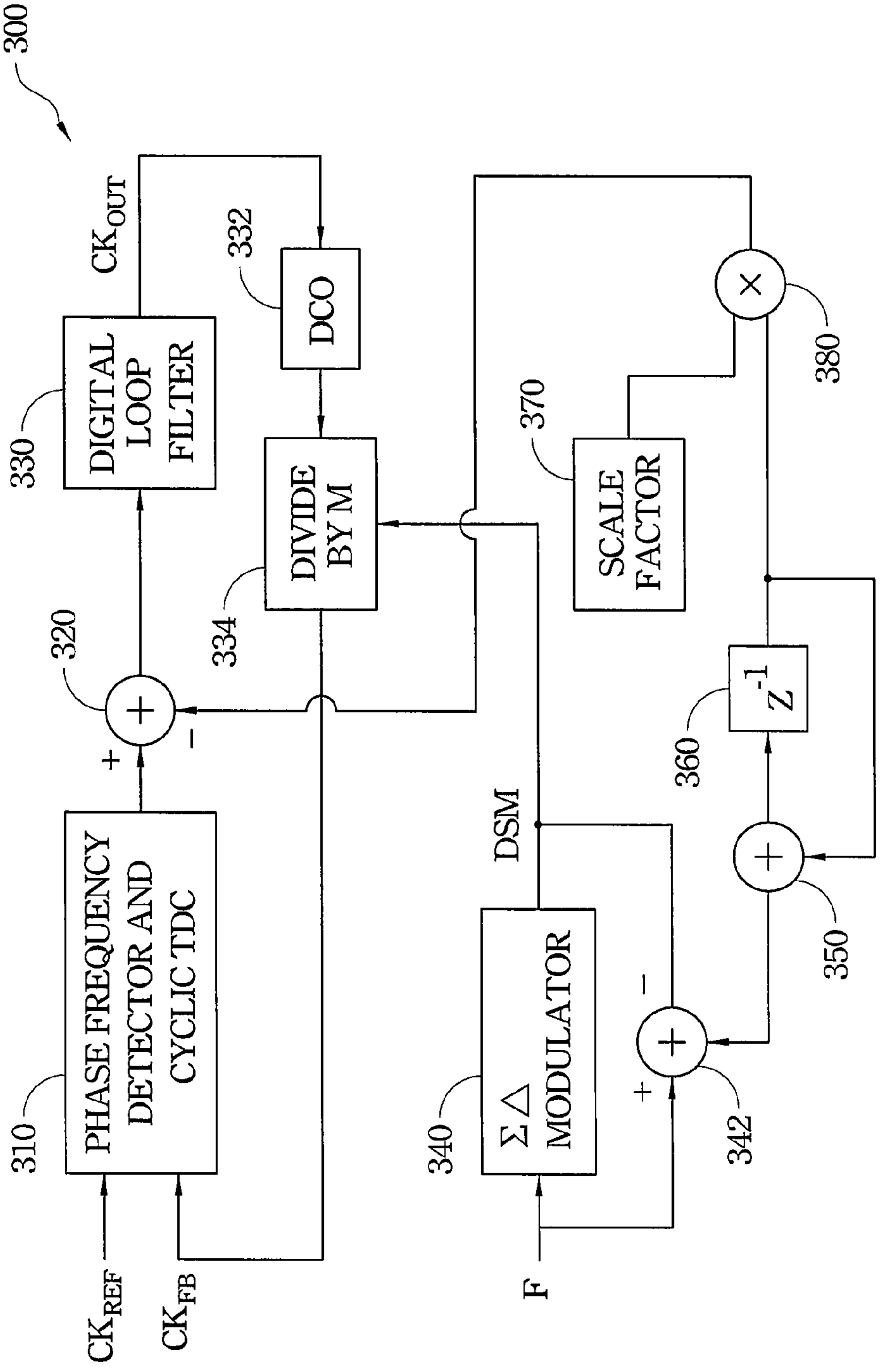
FIG. 3 (PRIOR ART)
FIG. 3 is a block diagram of another known timing circuit.

The cancellation loop reduces phase noise similar to the cancellation loop in timing circuit 200. In the following discussion, reference is made to elements of timing circuit 200 in FIG. 2, although it should be understood that such elements are implemented in embodiments of the present subject matter as described below. The cancellation loop cancels the phase error between $CK_{IN}$ and $CK_{DIV}$ if the divisor is changed, which occurs during fractional variation for a fractional PLL. The counter 960, which controls the divisor, can predict the phase error. For example, if an average divisor is 1.25 (fractional part=0.25), the divisor may be varied as follows: 1, 1, 1, 2 to achieve a cumulative effect of 5/4=1.25, i.e., the output of counter 960 over time (i.e., signal DSM as in FIG. 3) may be 0, 0, 0, 1 (to increment the divisor). The numerator value F is 0.25, 0.25, 0.25, and 0.25 in comparison. Regarding phase error, $CK_{IN}$ may develop a lag at each iteration, e.g., may be in phase with $CK_{OUT}$ during a first iteration, may trail $CK_{OUT}$ by 0.25 periods of $CK_{OUT}$ after one iteration, may trail $CK_{OUT}$ by 0.5 periods after another iteration, may trail $CK_{OUT}$ by 0.75 periods after another iteration, and may be in-phase again after another iteration. Subtracting DSM from F as at adder 342 yields cancellation factors of 0.25, 0.25, 0.25, −0.75. Adding these cancellation factors to the phase error described above yields a sum term of 0.25, 0.5, 0.75, 0, i.e., the phase error is canceled. Thus, this sum term multiplied by a scale factor equals the phase error, where the scale factor is the ratio between output period and TDC resolution (which is the delay time of a delay cell).

Figure 10:
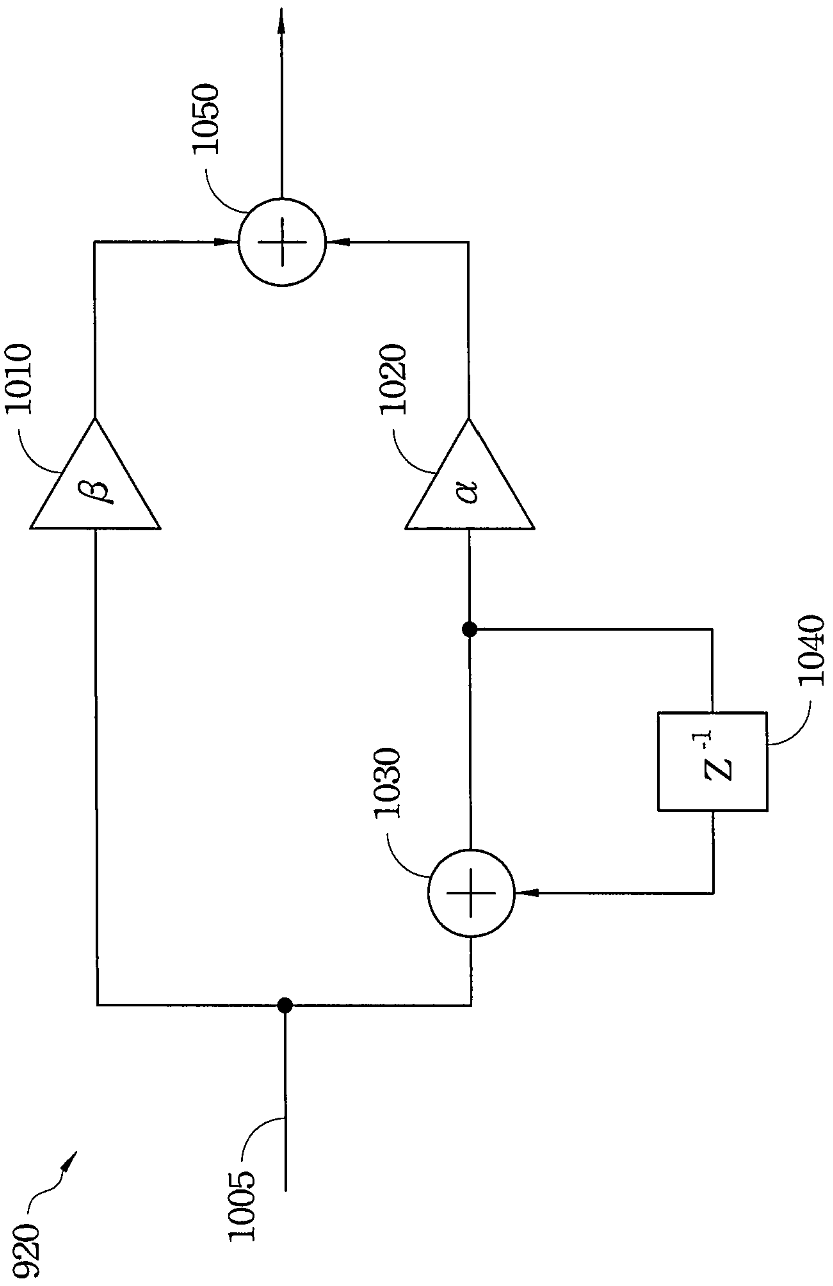
FIG. 10 is a block diagram of a digital loop filter in accordance with a phase locked loop embodiment.

FIG. 10 is a block diagram of a digital loop filter (DLF) in accordance with a phase locked loop embodiment. DLF 920 provides a digital output that is used as a control signal to frequency tune DCO 930, as is known in the art. Functionally, DLF 920 performs a low pass filtering operation as shown in FIG. 10, and DLF 920 may be implemented in various ways known to one of ordinary skill in the art to achieve such functionality. An input signal 1005 may be represented as x[n]. Multipliers 1010, 1020, adders 1030, 1050, and delay element 1040 may be configured as shown in FIG. 10 to provide an output signal $y[n]=\beta x[n]+\alpha(x[n]+x[n-1])$. Low pass filtering smooths the inputs to the DCO, which is beneficial due to digitization effects, as is known in the art. Thus, DLF 920 provides equivalent functionality as a series resistor-capacitor (RC) circuit for low pass filtering.

Figure 11:
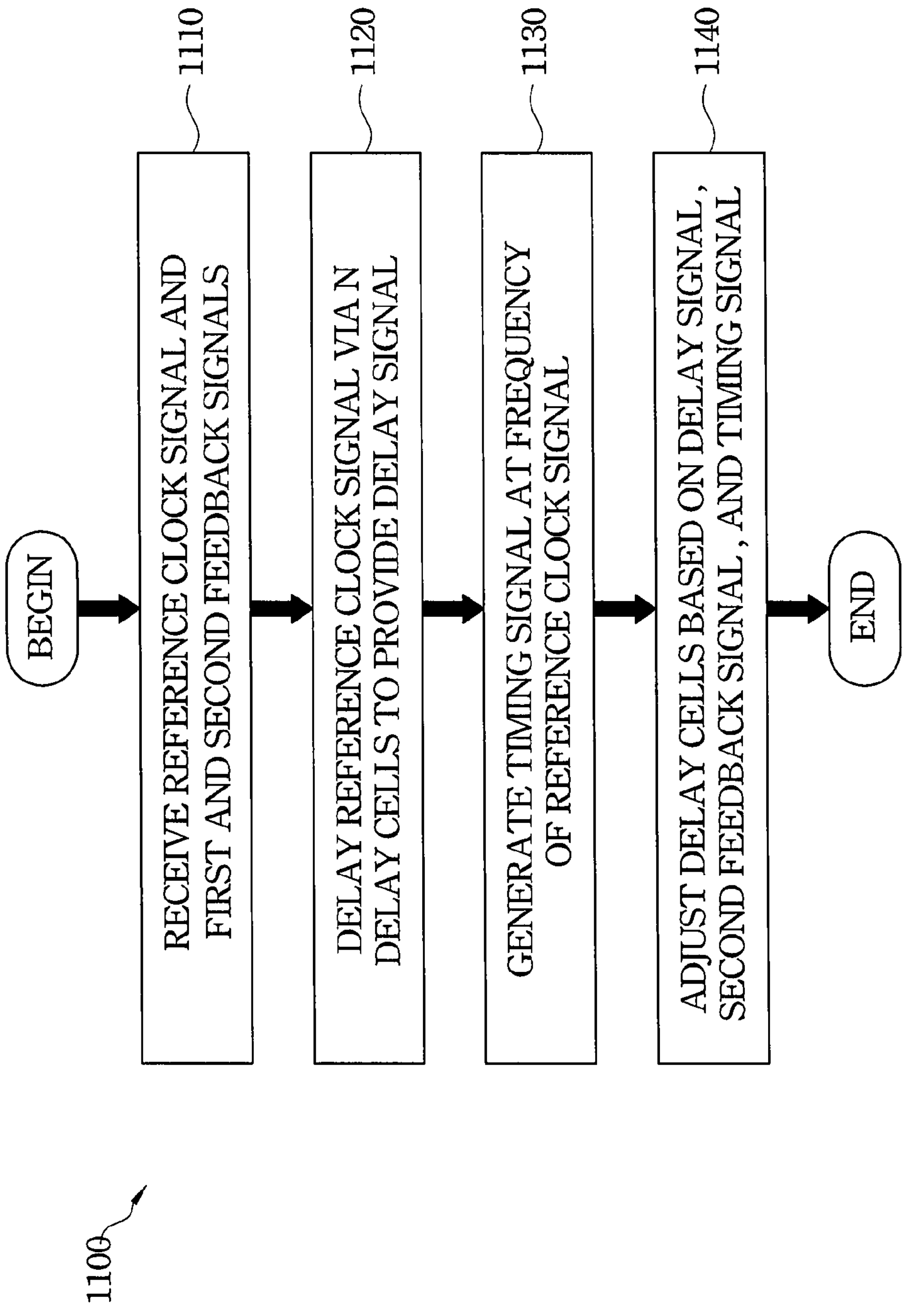
FIG. 11 is a flow diagram in accordance with an exemplary embodiment.
Figure 7:
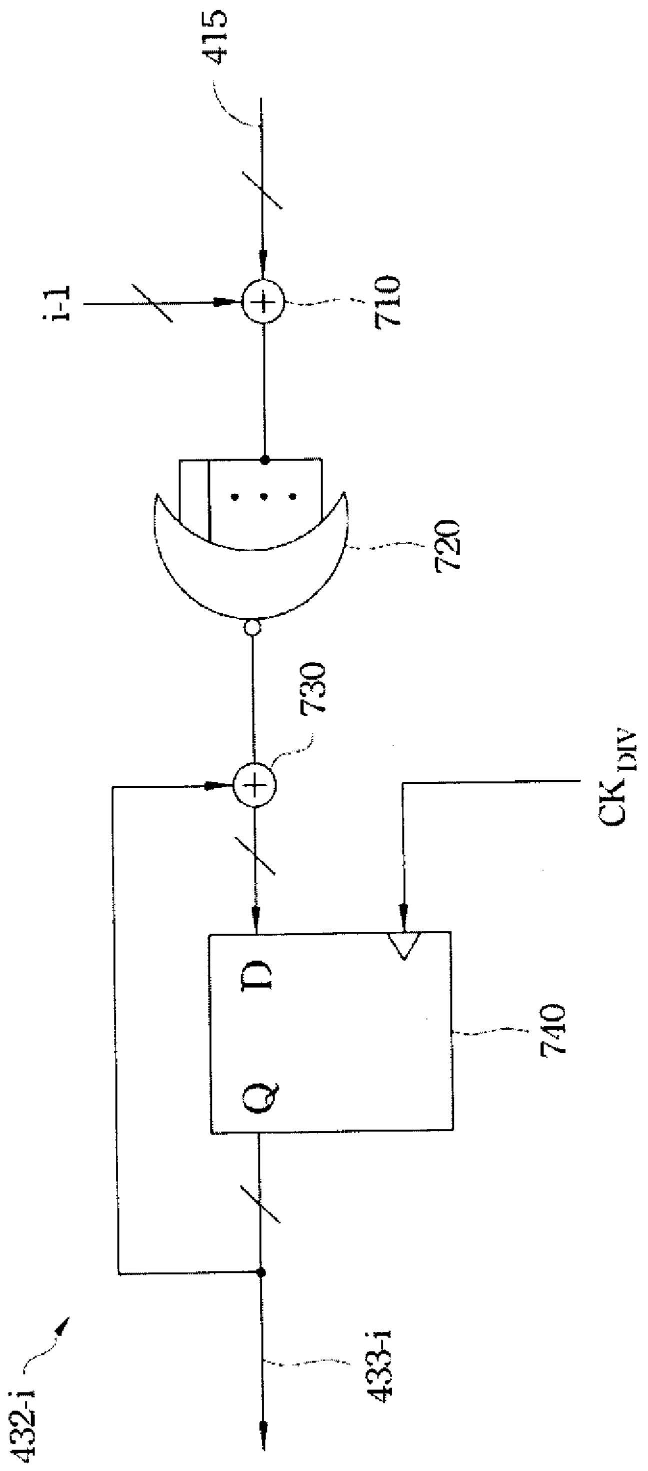
Figure 9A:
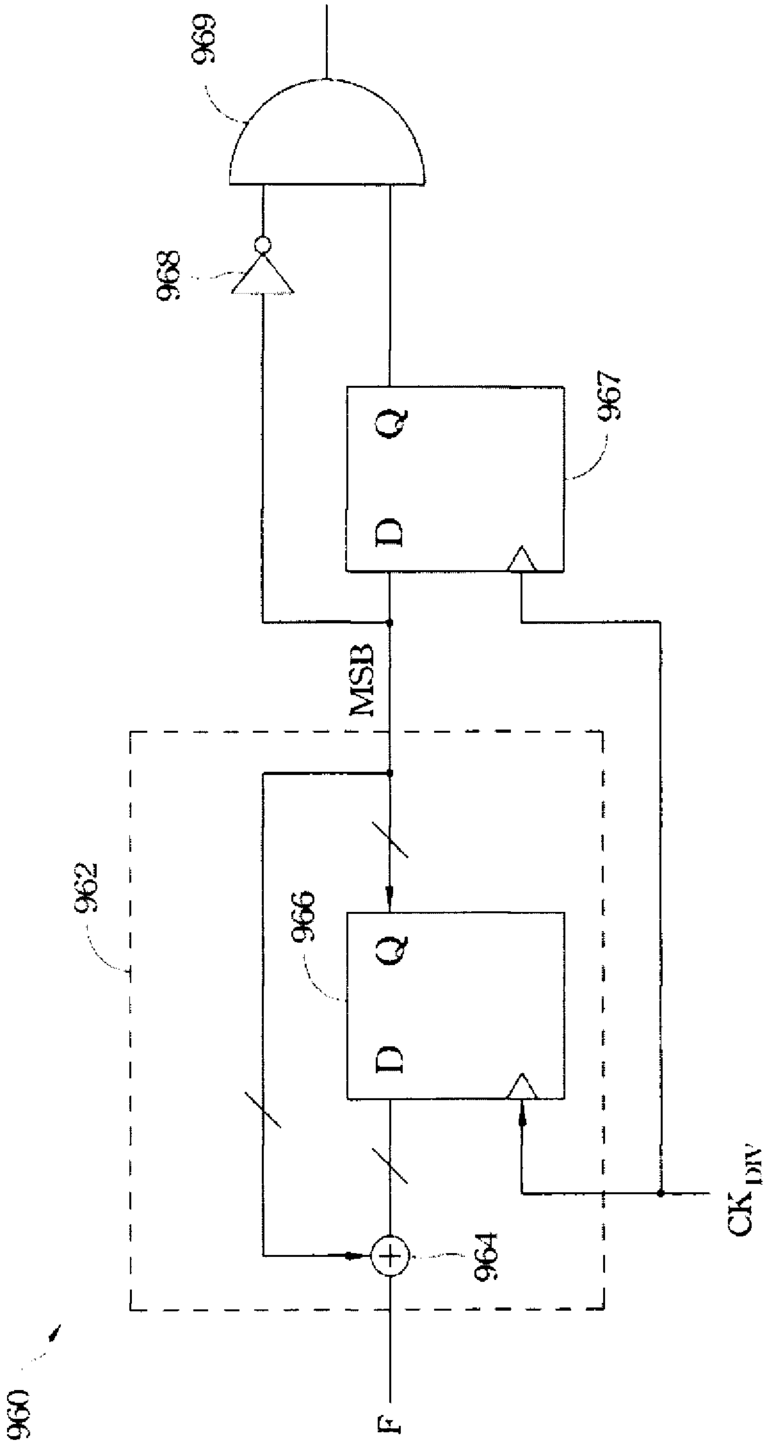

FIG. 11 is a flow diagram in accordance with an exemplary embodiment. After process 1100 begins, a reference clock signal and first and second feedback signals are received (1110). The reference clock signal is delayed (1020) via N delay cells to provide a delay signal. A timing signal is generated (1030) at a frequency of the reference clock signal. The timing signal is indicative of a timing difference between edges of the reference clock signal and of the first feedback signal. Delay cells are adjusted (1040) based on the delay signal, the second feedback signal, and the timing signal to calibrate a total delay of the delay cells and to reduce mismatch among delay cells. Although process 1100 is shown as subsequently ending in FIG. 11, it should be understood that process 1100 may continue in iterative format in accordance with the principles of phase locked loops to provide continual timing adjustments.

Various embodiments find wide application in communications systems, e.g., in Bluetooth and wireless LAN systems. Advantageously, various embodiments provide timing circuitry with reduced circuit complexity relative to the prior art. No multipliers are needed in the correction loop, saving circuit area and reducing power consumption. Similarly, pseudorandom number generators and clock doubling circuits are not needed, resulting in additional space and power savings. Calibration using only two inputs is faster than prior art calibration techniques that group greater than two (e.g., five) input signals together, and there are no input duty cycle restrictions unlike in prior art techniques that reserve, e.g., half of all samples exclusively for calibration. Various embodiments use simple circuit components, e.g., phase detectors, counters, accumulators, comparators, and registers, with underlying switching provided by latches, e.g., D-type flip flops.

Various embodiments have been implemented with success. The total die area can be made at least as small as 1.4 mm in length by 0.8 mm in width, with the area of TDC and digital logic circuitry being about 0.025 $mm^2$ in accordance with a 65 nm CMOS process. Conventional techniques typically require an area of greater than 0.1 $mm^2$ for TDC and digital logic circuitry. Various embodiments accommodate fast calibration in about four input clock cycles, compared to greater than twenty input clock signals in prior art implementations that group multiple input signals.

Table 1 lists performance results associated with noise performance of various embodiments.

| | Divisor | | | |
|---|---|---|---|---|
| | 40 (integral) | 40 + 1/64 | | |
| | Case | | | |
| | Conventional | Conventional | Add cancellation loop | Add cancellation and calibration loops |
| DCO code variation | 6 | 107 | 9 | 4 |

Table 1 shows DCO code variation for various cases, where less variation in the digital code is better, indicative of tighter timing control. Table 1 shows performance for integral clock division (with division by 40) and fractional division by 40+1/64. Conventionally, code variation of 107 is exhibited with fractional operation, which is worse than code variation of 6 with integral operation. With a cancellation loop alone, code variation is reduced to 9, and with cancellation and calibration loops in accordance with various embodiments, code variation is reduced to 4. Thus, phase noise is reduced by 20 log(107/4)=28.55 dBc/Hz by the various disclosed embodiments. Power consumption is less than 2 mW with the various embodiments. Additionally, the use of a correction loop in various embodiments mitigates undesirable spurs. Thus, various embodiments advantageously provide superior performance in terms of phase noise and spurs relative to the prior art, provide increased efficiency in terms of power, area, and speed, and provide reduced circuit complexity.

The above illustrations provide many different embodiments for implementing different features. Specific embodiments of components and processes are described to help clarify the invention. These are, of course, merely embodiments and are not intended to serve as limitations beyond those described in the claims.

Although embodiments are illustrated and described herein in one or more specific examples, embodiments are nevertheless not intended to be limited to the details shown, since various modifications and structural changes may be made therein without departing from the spirit of the embodiments and within the scope and range of equivalents of the claims.

What is claimed is:

1. A timing circuit comprising:
- a time to digital conversion (TDC) circuit configured to provide:
  - a timing signal indicative of a timing difference between edges of a periodic reference clock signal and a first feedback signal, and
  - a delay signal that is variably delayed relative to the reference clock signal;

- a calibration module configured to:
  - receive the delay signal and a second feedback signal, and
  - provide a calibration signal to increase and decrease a total delay of the TDC circuit, wherein the total delay of the TDC circuit is based on a time delay of the calibration signal plus a time delay of a correction signal; and
- a correction module configured to receive the timing signal and provide the correction signal, the correction module minimizing harmonic spurs in a frequency response of the timing signal by operating at a frequency of the reference clock signal.

2. The timing circuit of claim 1 wherein:
- the TDC circuit comprises:
  - a plurality of latches,
  - a first delay line, having multiple taps, coupled to the first feedback signal, each tap of the first delay line coupled to a clock input of a corresponding latch,
  - a second delay line, having multiple taps, coupled to the reference clock signal, each tap of the second delay line coupled to a data input of a corresponding latch, and
  - an encoder configured to encode outputs from the latches to provide the timing signal;
- the calibration module comprises:
  - a phase detector configured to compare a phase of the delay signal and a phase of the second feedback signal, and
  - a counter configured to accumulate an output of the phase detector; and
- the correction module comprises:
  - an array of accumulators configured to accumulate values of the timing signal;
  - an array of comparators coupled to the array of accumulators, each comparator configured to compare one of a plurality of P-bit constant values with an output from a corresponding accumulator; and
  - an array of registers configured to accumulate and store outputs from the comparators.

3. The timing circuit of claim 2 wherein the phase detector comprises a latch having a data input coupled to the delay signal and a clock input coupled to the second feedback signal.

4. The timing circuit of claim 3 wherein each accumulator comprises:
- a first P-bit adder configured to receive one of the P-bit constant values as a first input and the timing signal as a second input;
- at least one logic gate configured to receive P input signals from an output of the first P-bit adder;
- a second P-bit adder configured to receive an output of the at least one logic gate as a first input; and
- a latch configured to:
  - receive a P-bit output from the adder as a data input and the first feedback signal as a clock input, and
  - provide a P-bit output signal coupled to a second input of the second P-bit adder.

5. The timing circuit of claim 4 wherein the at least one logic gate effects a NOR logic function.

6. The timing circuit of claim 4 wherein each register comprises:
- a P-bit adder configured to receive an output from a corresponding comparator at a first input; and
- a latch having a data input coupled to an output of the P-bit adder of the register and having an output coupled to a second input of the P-bit adder of the register.

7. The timing circuit of claim 6 wherein the latches in the TDC circuit, the latch in the phase detector, the latches in the accumulators, and the latches in the registers are D-type flip flops.

8. The timing circuit of claim 7 wherein the TDC circuit comprises $2^P$ delay cells in the second delay line, and the correction module comprises $2^P$ accumulators, $2^P$ comparators, and $2^P$ registers, each delay cell in the second delay line corresponding to a distinct accumulator, comparator, and register.

9. The timing circuit of claim 8 wherein the correction signal is provided as $2^P$ individual correction signals, each individual correctional signal provided by a corresponding register and added to the calibration signal to adjust a delay of a corresponding delay cell in the second delay line.

10. The timing circuit of claim 8 wherein a distinct integer between 0 and $2^P-1$, inclusive, is provided as the constant value to each accumulator and to each comparator.

11. The timing circuit of claim 1 wherein the second feedback signal is the first feedback signal shifted in time.

12. The timing circuit of claim 1 wherein the delay signal lags the first feedback signal by one period of the reference clock signal in a calibrated state.

13. The timing circuit of claim 1, further comprising:

a digital loop filter configured to provide a digital control signal based on the timing signal;

a digitally controlled oscillator configured to tune a frequency of an output clock signal based on the digital control signal;

a divider configured to divide the output clock signal in frequency by an integer M or an integer M+1 and provide a divided signal that feeds back to the TDC circuit as the first feedback signal and that feeds back to the calibration module as the second feedback signal; and a counter configured to accumulate the first feedback signal and provide an increment signal, the increment signal causing the divider to divide by M+1 instead of M in an event that an accumulated sum of the first feedback signal exceeds a predetermined threshold.

14. A method of controlling timing of signals, the method comprising:

receiving a reference clock signal and first and second feedback signals;

delaying the reference clock signal via N delay cells to provide a delay signal;

generating, at a frequency of the reference clock signal, a timing signal indicative of a timing difference between edges of the reference clock signal and of the first feedback signal; and adjusting the delay cells based on the delay signal, the second feedback signal, and the timing signal to calibrate a total delay of the delay cells and to reduce mismatch among delay cells.

15. The method of claim 14 wherein generating the timing signal comprises:

providing delay taps from the delay cells to clock inputs of respective ones of a plurality of latches;

conditionally switching respective latches to delayed values of the first feedback signal; and encoding, based on outputs from the latches, a position among the latches where outputs of the latches change from a first logic value to a second logic value, to provide the timing signal.

16. The method of claim 14 wherein adjusting the delay cells comprises:

detecting a phase difference between the delay signal and the second feedback signal to provide a phase detection signal;

accumulating the phase detection signal to provide a calibration signal; and adjusting each delay cell based on the calibration signal.

17. The method of claim 16 wherein adjusting the delay cells further comprises:

accumulating each of N accumulation signals at a corresponding one of N accumulators until a condition based on the timing signal and one of N constant values is met;

comparing the accumulation signals to corresponding constant values to provide N comparison signals;

updating each of N registers based on a corresponding comparison signal to provide N correction signals at outputs of the registers; and adjusting each delay cell based on the correction signals to compensate for delay cell mismatch.

18. The method of claim 17, wherein adjusting each delay cell comprises:

adding the calibration signal to each of the correction signals to provide N delay update signals; and updating a delay of each delay cell based on a corresponding delay update signal.

19. The method of claim 17, wherein the condition is that a sum of the constant value and the timing signal is a P-bit digital value having a logical high value at each of P bits, wherein $N=2^P$.

20. The method of claim 18, further comprising providing a different integer between 0 and N−1, inclusive, as a corresponding constant value to each accumulator and comparator.

21. The method of claim 16, wherein accumulating the phase detection signal comprises:

incrementing a counter at clock edges specified by the second feedback signal; and providing an output of the counter as the calibration signal.

22. The method of claim 14, further comprising:

generating a digital control signal based on the timing signal via a low pass filtering operation;

tuning a frequency of an output clock signal based on the digital control signal;

dividing the output clock signal in frequency by an integer M or an integer M+1 to provide a divided signal;

feeding the divided signal back as the first and second feedback signals; and accumulating the first feedback signal;

wherein the output clock signal is divided in frequency by M+1 in an event the accumulated first feedback signal exceeds a predetermined threshold.

* * * * *

UNITED STATES PATENT AND TRADEMARK OFFICE

CERTIFICATE OF CORRECTION

PATENT NO. : 8,193,963 B2
APPLICATION NO. : 12/874462
DATED : June 5, 2012
INVENTOR(S) : You-Jeng Wang et al.

It is certified that error appears in the above-identified patent and that said Letters Patent is hereby corrected as shown below:

In the Drawings

Delete Drawing Sheet 8 of 13 and Drawing Sheet 11 of 13 and substitute therefore with the attached Drawing Sheet 8 of 13 and Drawing Sheet 11 of 13.

Signed and Sealed this
Twenty-seventh Day of January, 2015

Michelle K. Lee
*Deputy Director of the United States Patent and Trademark Office*